(12) United States Patent  
Abdulaziz

(10) Patent No.: US 12,255,376 B2
(45) Date of Patent: Mar. 18, 2025

(54) TUNABLE DIFFERENTIAL TRANSMISSION LINE SEGMENT

(71) Applicant: Telefonaktiebolaget LM Ericsson (publ), Stockholm (SE)

(72) Inventor: Mohammed Abdulaziz, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 47 days.

(21) Appl. No.: 18/274,260

(22) PCT Filed: Jan. 27, 2021

(86) PCT No.: PCT/EP2021/051875
§ 371 (c)(1),
(2) Date: Jul. 26, 2023

(87) PCT Pub. No.: WO2022/161604
PCT Pub. Date: Aug. 4, 2022

(65) Prior Publication Data
US 2024/0097304 A1      Mar. 21, 2024

(51) Int. Cl.
*H01P 3/02* (2006.01)
*H01P 1/00* (2006.01)
*H03K 17/687* (2006.01)

(52) U.S. Cl.
CPC ........... *H01P 3/026* (2013.01); *H01P 1/00* (2013.01); *H03K 17/687* (2013.01)

(58) Field of Classification Search
CPC ....................................................... H01P 3/026
USPC ......................................................... 327/564
See application file for complete search history.

(56) References Cited

U.S. PATENT DOCUMENTS

| 2014/0085012 A1 | 3/2014 | Wu et al. |
| 2014/0320238 A1 | 10/2014 | Forstmaler |
| 2017/0170799 A1 | 6/2017 | Kong et al. |
| 2017/0338808 A1 | 11/2017 | Andreani et al. |

(Continued)

FOREIGN PATENT DOCUMENTS

CN      105811057 B      7/2019

OTHER PUBLICATIONS

International Search Report and Written Opinion issued in International Application No. PCT/EP2021/051875 dated Oct. 18, 2021 (10 pages).

(Continued)

*Primary Examiner* — Tomi Skibinski
(74) *Attorney, Agent, or Firm* — Rothwell, Figg, Ernst & Manbeck, P.C.

(57) ABSTRACT

The present application concerns a tunable differential transmission line segment, comprising a differential pair of signal line segments (10) arranged in a first plane. A pair of tuning line segments (20) is arranged in a second plane substantially parallel to the first plane, wherein the pair of tuning line segments (20) is at least capacitively coupled to the differential pair of signal line segments (10). The pair of tuning line segments (20) is connected with its respective end terminals (22, 23) to a common reference potential and further comprises a tunable element (24, 25) arranged between a first portion (26) and a second portion (27) of the pair of tuning line segments (20) and configured to change the impedance of the pair of tuning line segments (20).

26 Claims, 10 Drawing Sheets

(56) References Cited

U.S. PATENT DOCUMENTS

2020/0321672 A1* 10/2020 Kopp ........................ H01P 3/08

OTHER PUBLICATIONS

Zhuang, W., et. al., "Common-Mode Suppression Design for Gigahertz Differential Signals", Progress In Electromagnetics Researc C, vol. 61, 17-26, 2016 (10 pages).
Woods, W. H., et. al., "CMOS Millimeter Wave Phase Shifter Based on Tunable Transmission Lines", IEEE, 2013 (4 pages).
Sadhu, B., et. al., "A 28-GHz 32-Element TRX Phased-Array IC With Concurrent Dual-Polarized Operation and Orthogonal Phase and Gain Control for 5G Communications", IEEE Journal of Solid-State Circuits, vol. 52, No. 12, Dec. 2017 (19 pages).

* cited by examiner

US 12,255,376 B2

TUNABLE DIFFERENTIAL TRANSMISSION LINE SEGMENT

CROSS REFERENCE TO RELATED APPLICATIONS

This application is a 35 U.S.C. § 371 National Stage of International Patent Application No. PCT/EP2021/051875, filed 2021 Jan. 27.

TECHNICAL FIELD

The present disclosure relates to a tunable differential transmission line segment, to a quadrature voltage oscillator, a transmitter and receiver arrangement as well as a mobile radio apparatus.

BACKGROUND

Modern communication technologies and standards operate usually at frequency ranges, which are considered to be microwaves that is above 10 GHz and up to several hundred GHz. However, as the technology scaling is slower, the use of lumped components becomes more difficult. Given that the resonance frequency is proportional to $1/\sqrt{LC}$ with L as inductance and C as capacitance, value of the inductance L required to resonant with the parasitic (or physical tuning) capacitance C becomes very small and eventually becomes unpractical to implement for increasing operating frequencies. In the above frequency ranges of about 100 GHz and above, the Q value of the tuning capacitors (e.g. in VCOs or phase shifters) at those frequencies is very small and results in increased loss.

Transmission lines (TLs) have become a potential candidate at very high frequencies >100 GHz. The characteristic impedance (Zo) of such transmission line is given by $$Z_0 = \sqrt{\frac{L_{unit}}{C_{unit}}}$$

The group delay GD usually used to tune a transmission line is given by $$GD = \sqrt{C_{unit}L_{unit}}$$

where $L_{unit}$ is the modeled inductance of the line per unit length while $C_{unit}$ is the modeled capacitance per unit length Tuning the frequency of the transmission line can be done by tuning $L_{unit}$ or $C_{unit}$ however, it is desired to tune both at the same time to maintain matching by maintaining a constant Zo which—when matched—results in minimized loss.

Woods et al "CMOS millimeter wave phase shifter based on tunable transmission lines," Proceedings of the IEEE 2013 Custom Integrated Circuits Conference, San Jose, CA, 2013, pp. 1-4 proposes a tuning scheme where capacitors are switched on together with a line running underneath the TL. This ensures that the characteristic impedance Zo is constant while GD is effectively tuned.

B. Sadhu et al., "A 28-GHz 32-Element TRX Phased-Array IC With Concurrent Dual-Polarized Operation and Orthogonal Phase and Gain Control for 5G Communications," in IEEE Journal of Solid-State Circuits, vol. 52, no. 12, pp. 3373-3391, December 2017, suggests parallel transmission lines used for tuning.

These prior art designs require large chip area when using single ended lines laid out close to each other, but not too close to avoid cross talk. Differential lines will be even more area consuming. To achieve a good tuning resolution the power consumption is significantly increased, which causes additional heat to be produced. These issues cause natural obstacles when implementing tunable elements for microwave components in the range of several 10 GHz to hundreds of GHz.

SUMMARY

An object of the present disclosure is to provide a tunable differential transmission line segment, which seeks to mitigate, alleviate, or eliminate one or more of the above-identified deficiencies in the art and disadvantages singly or in any combination. A further object is to provide a variety of microwave components and applications that implement such tunable differential transmission line segment.

These and other objects are obtained by a tunable differential transmission line segment according to independent claim 1. Applications utilizing the tunable differential transmission line segment according to the proposed principle are given by the further independent claims.

According to an aspect, a tunable differential transmission line segment comprises a differential pair of signal line segments arranged in a first plane; a pair of tuning line segments arranged in a second plane substantially parallel to the first plane, wherein the pair of tuning line segments is at least capacitive coupled to the differential pair of signal line segments; wherein the pair of tuning line segments is connected with its respective end terminals to a common reference potential and further comprises a tunable element arranged between a first portion and a second portion of the pair of tuning line segments and configured to change the impedance of the pair of tuning line segments.

The proposed tunable differential transmission line segment has a much low area consumption and can be implemented with different circuit printing techniques resulting in low cost overhead. The proposed tunable differential transmission line segment is designed based on individual segments. Several of such segments can be easily connected together to implement complete phase shifters. The tunable element allows tuning impedance of the tuning line from high impedance resulting in just a floating metal around the pair of signal line segments to low impedance, which introduces a pair of tuning line segments that are coupled to the pair of signal line segments therefore increasing the delay in the line.

In this regard, the term "differential" in tunable differential transmission line segment shall not be interpreted narrowly and restricted to signals with a 180° phase shift. Moreover, the term shall be understood more broadly and shall be associated with all signals having a specified phase shift between each other. For example, signals through the tunable differential transmission line segment may comprise a phase shift of (not exhaustive) one of 15°, 30°, 45°, 60° and 90° or integral multiples thereof. In view of such broader definition of the expression "differential", the proposed tunable differential transmission line segment allows to route multiple phases together in order to guide quadrature signals as the tuning lines become orthogonal (90° from each other).

Further in this regard, the expression "differential" in the tunable differential transmission line segment shall also not be restricted to two or a pair of line segments. Rather a plurality of pairs a signal lines segments can be arranged next to each other, wherein the signals in each pairs comprise a mutual phase shift to each other. The number of pairs of line segments are equal to the number of pairs of the tuning line segments.

In an aspect, the tunable element of the tunable differential transmission line segment comprises a pair of tunable resistors coupled to the first portion and the second portion. The pair of tunable resistors allow changing the real portion of the impedance, thus changing the coupling between the pair of signal line segments and the pair of tuning line segments. This will result in a wider bandwidth and tuning range for the proposed transmission line segment without sacrificing signal power, as the resistance change occurs only in the pair of tuning line segments.

In another aspect, each tunable resistor of the pair of tunable resistors comprises a field effect transistor between a first node and a second node with its gate terminal configured for receiving a control signal. Alternatively, the each tunable resistor of the pair of tunable resistors comprises a plurality of field effect transistors arranged in parallel between a first node and a second node with their respective gates configured to receive a digital control word. These two solutions therefore provide certain implementation flexibility and enable a precise adjustment of the phase delay. The proposed transmission line segment can have a high resolution. Further alternatively, the tunable resistor of the pair of tunable resistors can comprise a plurality of fixed resistors configured to be switched and connected between the first and second portion.

Further alternatively, the tunable element can also comprise a pair of tunable capacitances coupled to the first portion and second portion. The various options enable a high degree of freedom and flexibility when implementing the proposed differential transmission line segments.

In an aspect, the field effect transistors tunable differential transmission line segment comprises at least one of a metal-oxide field effect transistor, MOSFET, a junction field effect transistor, JFET and a metal—semiconductor field-effect transistor, MESFET. Field effect transistors are well understood and available in different material systems suitable for signals in the microwave range.

Another aspect relates to the tuning possibilities of the tunable resistors and particularly the plurality of field effect transistors. In an aspect, the plurality of field effect transistors each comprise a channel width and a channel length, the respective channel width or channel length of two adjacent field effect transistors being different by a factor of 2. A factor of 2 enables a binary tuning. In an alternative, the factor is just 1, that is the channel width and channel length of adjacent effect transistors are equal. Such factor causes a unitary tuning.

Several aspects relate to the structure and the relationship between the differential pair of signal line segments and the pair of tuning line segments. In an aspect, the differential pair of signal line segments and the pair of tuning line segments are at least partially overlapping, when the transmission line segment is viewed from top or bottom. The coupling factor between the transmission line segments and the pair of tuning line segments is dependent on the level of overlapping. In other words, proper designing the structure and level of overlap allows adjusting the coupling and thus the tuning over a wide range.

In an aspect, the differential pair of signal line segments and the pair of tuning line segments comprise the same shape, and/or dimensions. In a further aspect, a width of each line segment of the pair of tuning line segments can be larger than a corresponding line segment of the pair of signal line segments. The width of the tuning line segments also affects the coupling factor, giving a degree of freedom when designing the proposed differential transmission line segment. In a further aspect, each of the first and the second portions of the pair of tuning line segments comprises a first elongated strip and a second elongated strip arranged parallel to the first elongated strip. Both elongated strips are coupled together at their respective ends. Such solution will require only a small space and enables a relatively strong coupling between the different line segments.

In another aspect, the first portion of the pair of tuning line segments of the tunable differential transmission line segment comprises at least one first V-shaped elongated strip and at least one second V-shaped elongated strip arranged such that it mirrors the at least one first V-shaped elongated strip of the first portion along an axis through the respective end terminals. The second portion of the pair of tuning line segments comprises at least one first V-shaped elongated strip and at least one second V-shaped elongated strip arranged such that it mirrors the at least one first V-shaped elongated strip of the second portion along an axis through the respective end terminals. In such implementation of the tuning lines, the electromagnetic field becomes at least partially perpendicular and the electromagnetic field interaction is minimized. To further adjust the coupling, in some aspects, the tips of the at least one first and second V-shaped elongated strips of the respective first and second portions may extend beyond the differential pair of signal line segments, when looking of the segment from the top or bottom.

In order to reduce signal reflections and follow implementation practices for printed circuit boards, legs of the at least one first and second V-shaped elongated strips may form an angle between 40° and 115°, and in particular one of 45°, 60°, 90° and 120°. In some aspects, tips of the at least one first and second V-shaped elongated strips of the respective first and second portions comprise a section extending substantially parallel to the differential pair of signal line segments. In some aspects, the first and the second portions of the pair of tuning line segments comprise the same number of first and second V-shaped elongated strips, thus providing symmetry around the tuning elements. First and second portions are equally implemented and just mirrored along the tuning element.

In some aspects concerning the implementation of the line segment, the differential pair of signal line segments and the pair of tuning line segments comprise lumped elements arranged on a printed circuit board and/or are surrounded by a dielectric material. This will allow building the proposed transmission line segment for different frequency ranges. In an instance, the proposed tunable differential transmission line segment is configured such that the dimensions of the differential pair of signal line segments are suited to conduct an electromagnetic signal with a center frequency above 60 GHz, and in particular between 90 GHz and 150 GHz.

Some other aspect relates to applications and implementations of the proposed tunable differential transmission line segment in various microwave components or other devices. In some aspects, an inverter chain is proposed that comprise a plurality of inverter arranged in series to each other. An output of the last inverter is coupled to an input of a first converter to form a series quadrature oscillator. A tunable differential transmission line having one or more proposed tunable differential transmission line segments may be arranged between one of the inverters of the inverter chain and a subsequent inverter. That is the tunable differential transmission line segments are connected to the output of the inverter and to an input of the subsequently arranged inverter. In some aspects, a plurality tunable differential transmission line segments is connected to respective outputs of the inverter in the inverter chain. Hence, in such configuration, a series oscillator or resonator may be formed in which inverters and tunable differential transmission line segments are arranged alternately. In an aspect, the at least one tunable differential transmission line segment comprises a phase shifting range depending on the number of segments connected together.

Another aspect concerns a transmitter arrangement for use in radio communication, which comprises at least one quadrature voltage controlled oscillator for generating a high frequency signal; or at least one tunable differential transmission line comprising one or more tunable differential transmission line segments. Likewise, a receiver arrangement for use in radio communication may comprise at least one quadrature voltage controlled oscillator for generating a high frequency signal; or at least one tunable differential transmission line comprising one or more tunable differential transmission line segments. The one or more tunable differential transmission line segments in the transmitter or receiver arrangement can be part of a mixer, filters or any other microwave component. Finally, a mobile radio apparatus for use in mobile radio communication may comprise at least one of the transmitter arrangement and receiver arrangement.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

DETAILED DESCRIPTION

Figure 1:
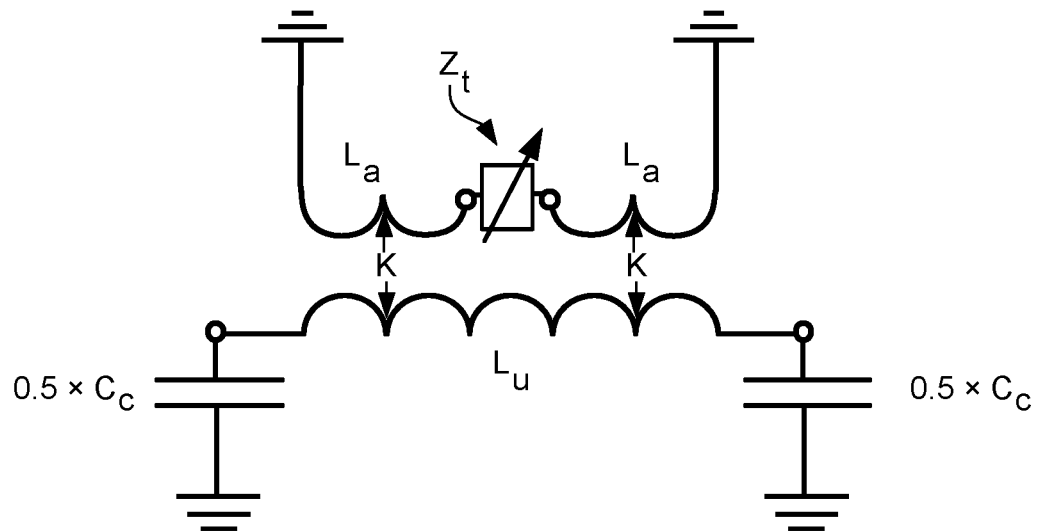
FIG. 1 is a schematic view of a tunable differential transmission line segment according to some aspects of the proposed principle.

Aspects of the present disclosure will be described more fully hereinafter with reference to the accompanying drawings. The devices, arrangements and systems disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

A "wireless device" as the term may be used herein, is to be broadly interpreted to include a radiotelephone having ability for Internet/intranet access, web browser, organizer, calendar, a camera (e.g., video and/or still image camera), a sound recorder (e.g., a microphone), and/or global positioning system (GPS) receiver; a personal communications system (PCS) user equipment that may combine a cellular radiotelephone with data processing; a personal digital assistant (PDA) that can include a radiotelephone or wireless communication system; a laptop; a camera (e.g., video and/or still image camera) having communication ability; and any other computation or communication device capable of transceiving, such as a personal computer, a home entertainment system, a television, etc. Furthermore, a device may be interpreted as any number of antennas or antenna elements.

Although the description is mainly given for a user equipment, UE, as measuring or recording unit, it should be understood by the skilled in the art that "user equipment" is a non-limiting term which means any wireless device, terminal, or node capable of receiving in DL and transmitting in UL (e.g. PDA, laptop, mobile, sensor, fixed relay, mobile relay or a radio base station, e.g. femto base station).

Also note that terminology such as eNodeB and wireless device should be considered as non-limiting and does in particular not imply a certain hierarchical relation between the two. In general "eNodeB" could be considered as device 1 and "wireless device" as device 2, and these two devices communicate with each other over some radio channel. Furthermore, while the example embodiments focus on wireless transmissions in the downlink, it should be appreciated that the example embodiments are equally applicable in the uplink.

Likewise, the expression "mobile radio apparatus for use in mobile radio communication" is broadly interpreted and includes the above-mentioned user equipment, any mobile device, the above-mentioned wireless device, and the eNodeB.

Some of the example embodiments presented herein are directed towards a tunable differential transmission line segment. As part of the development of the example embodiments presented herein, the behavior of the proposed tunable differential transmission line segments shall be explained using a lumped model of the structure.

FIG. 1 illustrates a lumped model of a tunable differential transmission line segment. According to some aspects of the proposed principle and in accordance with the model, the transmission line segment comprises a pair of signal lines including an inductance $L_u$. The segment can be characterized by a parasitic capacitance $C_p$, as well as a coupling capacitance $C_{coupling}$ to a tuning line. Both the parasitic capacitance and the coupling capacitance $C_{coupling}$ to the tuning line are lumped into a general coupling capacitance $C_c$. The tuning line comprises a pair of tuning lines as well with each line having two portions. Each portion is characterized by the same inductance $L_a$, and the portions are connected together using a tunable element providing a tunable impedance $Z_t$. The end terminal of both portions are connected to ground in this model. For symmetry purposes, the coupling capacitance $C_c$ is divided into half of its respective value $0,5*C_c$ at the respective end terminals of the inductance of the signal line. The characteristic impedance $Z_{o-segment}$ and group delay $GD_{segment}$ of such transmission line segment are therefore approximated by $$Z_{o-segment} = \sqrt{\frac{L_u}{C_c}}$$

$$GD_{segment} = \sqrt{C_c L_u}$$

The inductance of the tuning line $L_a$ to the inductance $L_u$ of the signal line is dependent on a coupling factor K. Said coupling factor is inter alia dependent of an impedance $Z_t$ of the tunable element in between the two portions of the tuning line.

The tunable element comprises a tunable resistance value $R_t$. Assuming a high resistance for $R_t$, the overall impedance of the tuning line including both portions is also quite high and the coupling factor K is low. With decreasing $R_t$, the overall impedance of the tuning line decreases as well. This causes on the one hand a slight increase of the coupling capacitance $C_{coupling}$ between the signal line and the tuning line resulting in an increase of $C_c$. In addition, the inductance $L_u$ of the signal line decreases effectively due to the increasing coupling factor K.

As a result, the group delay $GD_{segment}$ of the signal line is changed causing a controlled phase shift at the observed frequency. At the same time, the change of the resistance R t and the impedance of the tuning line causes decreases in the matching given by $Z_{o-segment}$. However, the change in capacitance is not large and matching is maintained as will be shown in s-parameter simulations. Having one segment designed, multiple segments can be cascaded to achieve the required phase shift while matching is maintained. The loss of a multiple segment line is roughly the sum of the losses of each segment.

Figure 2:
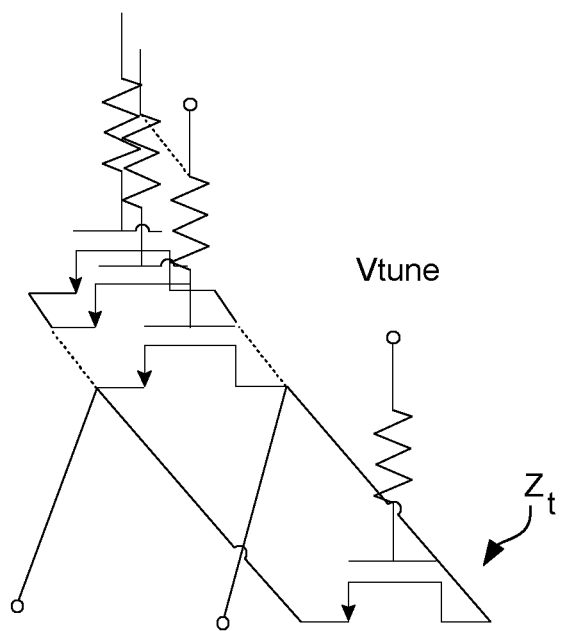
FIG. 2 shows a schematic view of a tunable resistive element being part of tunable differential transmission line segment according to some aspects of the proposed principle.

FIG. 2 illustrates a schematic view of a tunable element that is suitable to connect the two portions of the tuning line. The tunable element comprises a plurality of field effect transistors that are arranged in parallel. Their respective source and drains terminals are connected to common terminals, which are coupled to the portions (not shown herein). Each of the field effect transistors comprise a channel width and a channel length and acts as tunable resistor when a control signal Vtune is applied at its respective gate. While drains or surface capacitance may also vary in dependence of the control signal Vtune, the resistance in the channel can be controlled over a wide frequency range, thus changing the real portion of the overall impedance of the tunable element. In this example, the field effect transistors comprise the same structure that is the same channel length and width. They are be controlled by a digital signal, that is switching the respective transistors into the signal path or removing them therefrom. This structure therefore implements a digital control of the phase shift resulting in a unitary tuning.

However, it is possible to use also analog signals to control the resistance. Further, the channel length and/or width may vary between adjacent transistors enabling a binary tuning of the tunable element.

Figure 3:
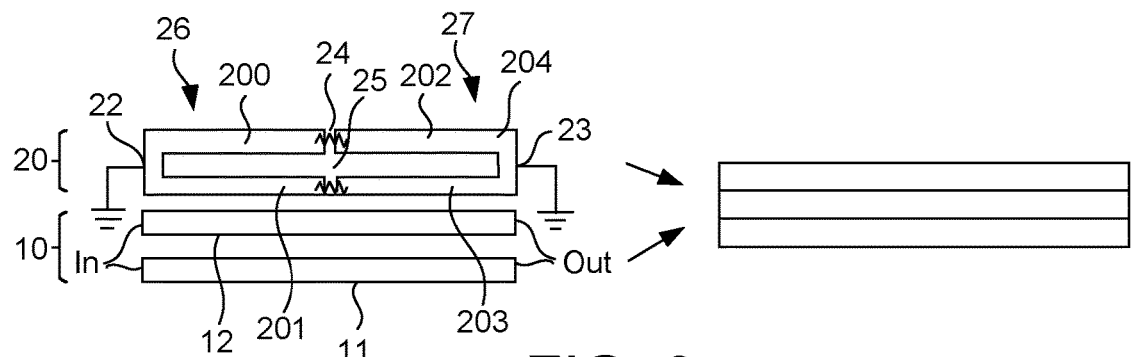
FIG. 3 is first embodiment of tunable differential transmission line segment according to some aspects of the proposed principle.

FIG. 3 illustrates a first embodiment of the tunable differential transmission line segment. According to some aspects of the proposed principle, the left drawing in the respected figure shows a pair of signal line segments 10 as well as the tuning line segments 20 next to each other to better illustrate the various aspects of the proposed principle. The right portion of the respective figure illustrates a top view of the tunable differential transmission line segment as implemented in a microwave component. Referring to the left portion, the pair of signal line segments 10 comprises a first signal line 11 and a second signal line 12, both lines implemented as elongated strips. Each line 11 and 12 includes an input terminal In and an output terminal Out, to which other microwave component can be attached to.

The pair of tuning lines 20 is divided into a first portion 26 and a second portion 27. Each of the first and second portions 26, 27 comprise a U-shaped structure. The first portion 26 includes a first and second leg portion 200 and 201. At the left end, both legs are electrically coupled together and connected to a ground terminal 22. Likewise, the second portion 27 comprises two legs 202 and 203 connected together at tip 204 and forming the ground terminal 23. The two portions 26 and 27 are electrically coupled together via tuning elements 24 and 25, respectively. Each tuning element 24 and 25 is arranged between the respective legs 200, 202 and 201, 203. The tunable elements include the tunable resistor to change the overall impedance of the pair of tuning lines 20 to form the respective tunable differential transmission line segment. The pair of tunable lines 20 are arranged below or above the pair of signal lines 10 with a small insulation layer in between. The thickness of the insulation layer will constitute the coupling between the pair of tuning lines and signal lines, respectively. The resulting structure is shown in the right portion of FIG. 3. Hence, as illustrated in top view on the right portion of FIG. 3, the pair of signal lines as well as the pair of tuning lines are stacked and arranged on top of each other. In these examples, the pair of tuning line segments are arranged below the respective layer of the signal line segments. The signal line segments are covering the respective tuning lines segments. However, stacking can also be reversed. In one example, the structure is embedded in an integrated circuit having the tunable lines 20 in one layer and the signal lines 10 in a neighboring layer. This could for example be the case in a circuit that is integrated in a 22 nm CMOS technology where the differential transmission line segment is embedded in the top two copper layers. Consequently, the structure in accordance to the principles proposed herein can be integrated in various layer of printed circuit boards.

The tunable differential line segment according to FIG. 3 is configured to be tuned by applying a respective control signal to the tunable elements. By doing so, the coupling between the pair of tuning lines and the pair of signal lines 10 is changed, resulting in a change of the inductance in the pair of signal lines 10 and to a lesser degree in a change of the coupling capacitance between pairs 20 and 10. The change of inductance causes a change in the group delay in the respective pair of signal lines 10. It should be noted that the structure is to be surrounded by a ground/supply plane with proper spacing once the structure is finalized. However, in the present example and the subsequent examples, this ground plane is omitted in order to simplify the presentation of the various embodiments.

Figure 4:
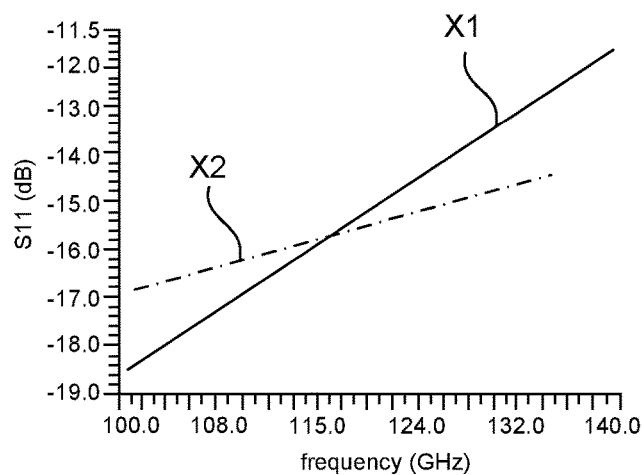
FIG. 4 shows various signal flow graphs illustrating exemplary S-parameters for the tunable differential transmission line segment of the first embodiment.
Figure 4:
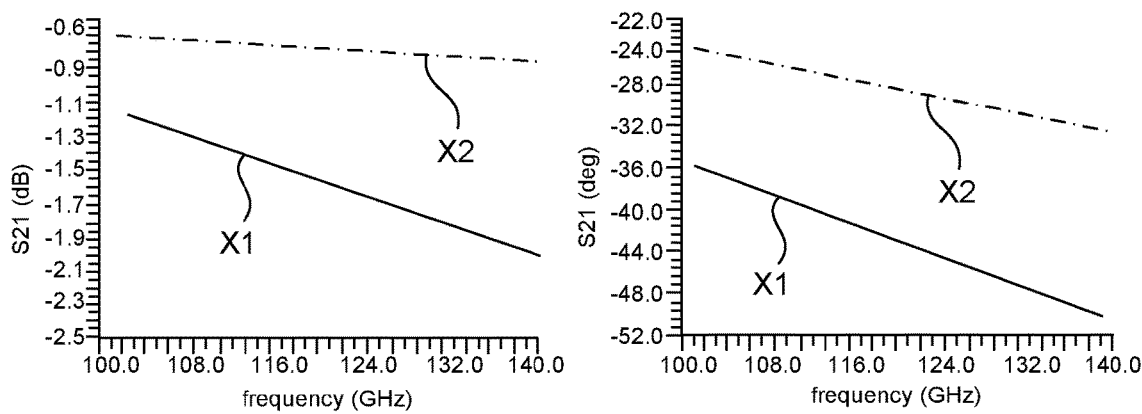

FIG. 4 illustrates various signal flow graphs showing several S-parameters for the tunable differential transmission line segment of the embodiment of FIG. 3. In the upper left graph, the reflection parameter S11 is illustrated versus the frequency within the frequency range of 100 to 140 GHz. The lower left graph illustrates the S21 parameter corresponding to the insertion loss over the respective frequency range. The lower right graph shows the phase change over the respective frequency range for a high and low tuning impedance. For simplicity purposes the graphs in this and the subsequent figures are labelled in accordance to their respective S-Parameter representation, that is S11(dB), S21 (dB) and S21(deg).

In each graph, two curves are fit. One curve corresponds to the behavior of the respective tunable differential transmission line segment with the tuning resistance set to a maximum value $R_t$=high, and the other curve corresponds to the behavior of the respective tunable differential transmission line with the tuning resistance set to a minimum value $R_t$=low, the latter causing a low impedance and high coupling between the pair of signal lines and the pair of tuning lines.

In the graph S11(dB), curve X1 represents the reflection over the frequency range of the tunable differential transmission line segment with the tuning resistance $R_t$ set to high. Input matching for all of those measurements and graphs are set to 50 Ohms. In such case, the pair of tuning lines behave like two separated U-shaped structures and the coupling between the pair of tuning lines 20 and the pair of signal lines 10 is relatively low. Curve X2 illustrates the behaviors for the reflection at a low impedance and thus high coupling. The reflection for $R_t$=low shows a stronger increase over the frequency range. At about 118 GHz, the reflection seems to be relatively independent of the tuning resistance.

In graph S21(dB) illustrating the insertion loss indicates that the loss increases slightly between low and high tuning value from around 0,45 0.65 dB at appr. 100 GHz to about 2 dB at appr. 140 GHz. However, at the same time, graph S21(deg) shows that the tuning range increases slightly from about 12° at 100 GHz to approximately 18° at 140 GHz. The insertion loss (absolutely) is 0.65 dB at 100 GHz and increases to about 2.05 dB at 140 GHz. It is possible to show that matching can be improved by tweaking the design to be centered to the middle of the desired band.

Figure 5:
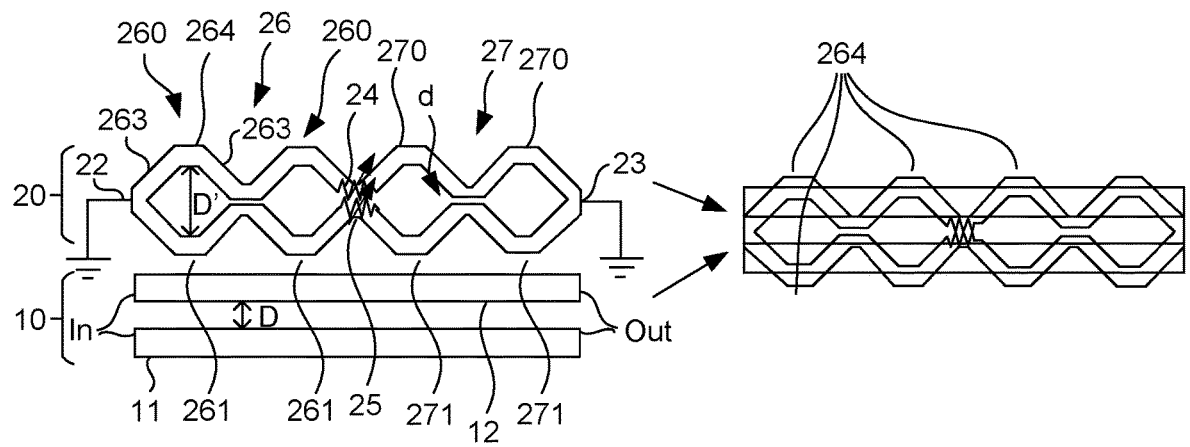
FIG. 5 is second embodiment of tunable differential transmission line segment according to some aspects of the proposed principle.

FIG. 5 illustrates a further embodiment showing several aspects in accordance with the proposed principle. As previously mentioned, the left figure illustrates the pair of signal lines 10 as well as the pair of tuning lines 20 shown next to each other to emphasize the various differences and the specific implementation of the pair of tuning lines.

The pair of signal lines comprises, as in the previous example two parallel elongated strips, wherein the distance D between the lines is chosen to be in the range of a few micrometers, for example 5 µm. The distance D is suitable to provide a differential pair of signal lines in the frequency range between 100 GHz to 150 GHz selected. The pair of tuning lines 20 comprises two portions 26 and 27, which include basically two mirror axes. A first mirror axis goes through the tuning elements 24 and 25, hence, the portions 26 and 27 are symmetrical. Another axis mirrors the structure of each portion along the ground terminals 22 and 23, respectively.

Each portion has a plurality of V-shaped elongated strips 260 and 270, forming a structure resembling a pair of eyes or an "infinity" symbol. More particularly, the first portion 26 includes two V-shaped elongated strips 260 each with two legs 263 and a tip 264 in between. One leg 263 of the first V-shaped structure is connected to ground terminal 22 and a leg of the other V-shaped elongated strip is connected to tuning element 24. The respective other legs are connected together. Likewise, first portion 26 includes two V-shaped elongated strips 261 mirroring the structure of strips 260. Hence, one leg of one of the strips 260, 261 is connected to each other and to end terminal 22.

In the area, in which the two legs of strip 260, 261 are connected together; the V-shaped elongated strips 260 and 261 are in close proximity with a small distance d to each other. The same structure also applies for the second portion and the strips 270, 271.

In other words, each V-shaped elongated element comprises two legs 263 connected to a common tip portion 264. This structure is repeated twice and then mirrored along an axis through terminals 22, 23 to form all strips of first and second portion. Hence, when seen from the top, the first portion as well as a second portion resembles a structure similar to an eye diagram, a "lying 8" or an infinity symbol. An angle between the legs of each portion (that is the angle associated with a virtual line parallel to the legs and extending through the tip) is approximately 90°, another angle at the respective end terminals is also approximately 90°. When looking in more detail, the tip portion 264 comprises a small element that is substantially parallel to lines 11 and 12 of the pair of signal lines.

First portion 26 and second portion 27 are coupled together by tunable elements 24 and 25, respectively. The first tunable element 24, for instance a tunable resistor is arranged between the end of the upper V-shaped elongated strip of first portion 260, and the upper V-shaped elongated strip 270 of the second portion 27. Likewise, the tunable resistor 25 is connecting the V-shaped elongated strip 261 to the V-shaped elongated strip 271.

In the tunable differential transmission line segment in accordance with the proposed principle, the pair of signal lines as well as a pair of tuning lines are stacked on top of each other. The stacking is performed such that the pair of tuning lines approximately extend below or above the signal lines when stacked on top of each other, but do not substantially extend beyond therefrom. In other words, only a small portion of the respective tips 264 for is extending beyond the outer limits of lines 11 and 12, respectively, when viewed from the top.

The arrangement of the pair of tuning lines using a 45° zig-zag structure reduces the electromagnetic field interaction, thus reducing the overall signal loss in the signal lines and improving the overall phase shift. It should be noted that more than one "pair of eyes" as first and second portion can be arranged sequentially to obtain the desired coupling to the transmission line segment.

Figure 6:
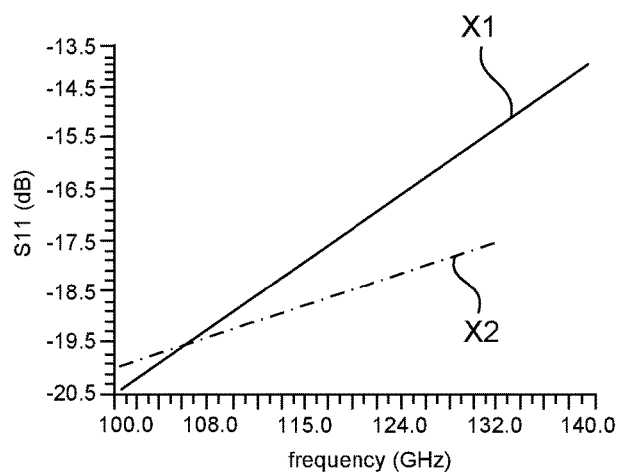
FIG. 6 shows various signal flow graphs illustrating exemplary S-parameters for the tunable differential transmission line segment of the second embodiment.
Figure 6:
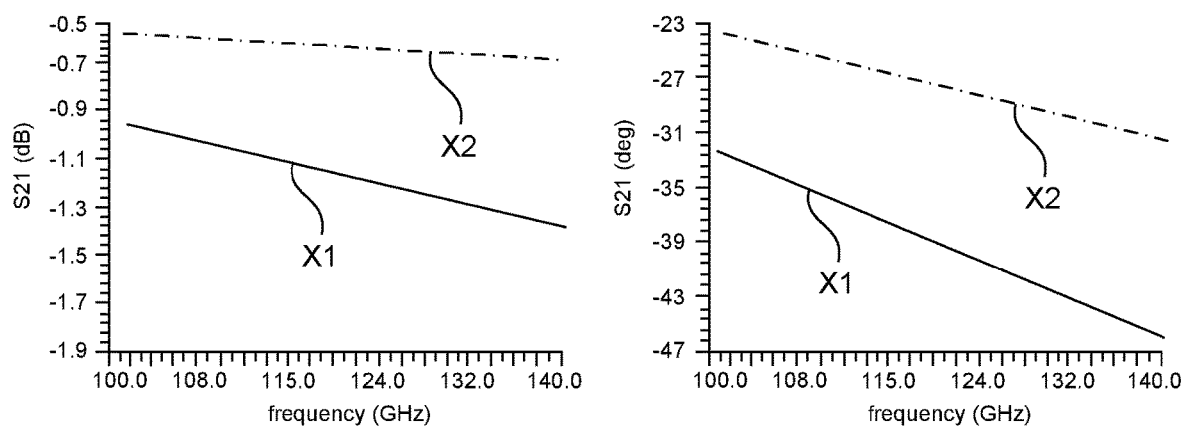

FIG. 6 shows the various graphs illustrating the different parameters. In contrast to the previous solution of straight elongated strips, the V-shaped structure with in total four V for each tuning line, the insertion loss is reduced. As illustrated in graph S21(dB), the insertion loss drops from about 0.55 at 100 GHz to approximately 0.68 at 140 GHz. Furthermore, the overall loss at high impedance in curve X1 changes only from −0.95 dB to approximately −1.4 dB, which is significantly less compared to the straight elevated lines as shown in FIG. 4 (curve X1 was −1.2 dB to about −2.1 dB for the embodiment of FIGS. 3 and 4). Graph S21(deg) also shows an improved phase tuning range starting from approximately 9° at 100 GHz between the low and the high tuning impedance values to about 15° at 140 GHz.

Figure 7:
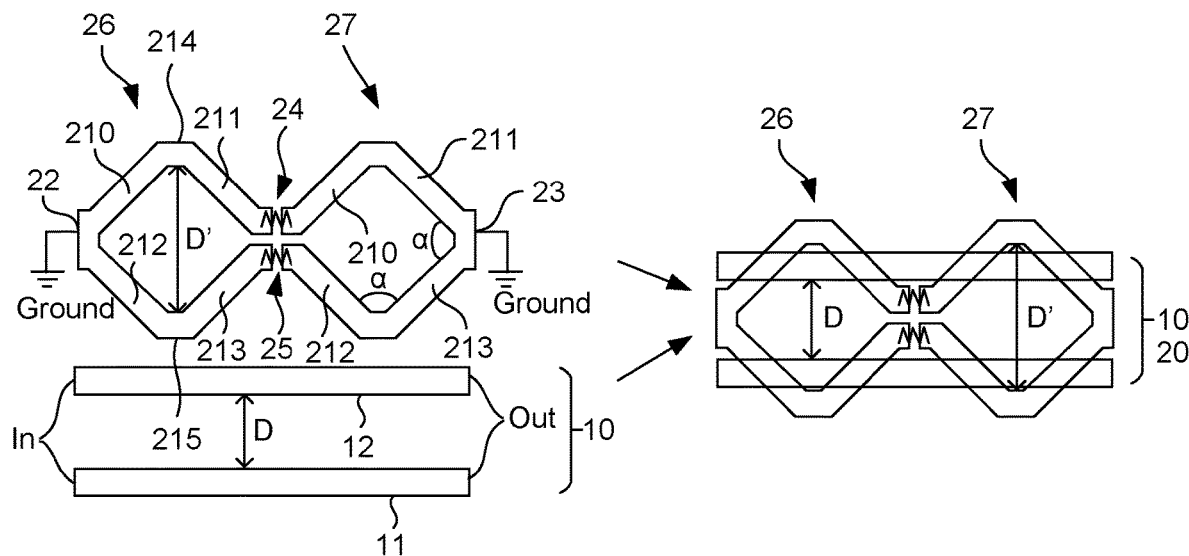
FIG. 7 is third embodiment of tunable differential transmission line segment according to some aspects of the proposed principle.

Referring now to FIG. 7. FIG. 7 illustrates a slightly different solution compared to the embodiment of FIG. 5. The pair of signal line comprises, as in the previous examples two parallel elongated strips with the distance D in the between the respective lines. The distance D in this example is higher than the corresponding distance for the previous examples and may be about 15 μm to 17 μm.

In contrast to the embodiment of FIG. 5, the pair of tuning lines 20 include a single eye-shaped structure having two portions 26 and 27, which are coupled by the tuning elements 24 and 25. Thus, both portions are, as in the previous examples, symmetrically arranged around the tuning elements 24 and 25 and connected to ground terminals 22 and 23. First portion 26 comprises 2 V-shaped structures. Each of the V-shaped structures comprises two legs, 210, 211 and 202, 213 with a tip portion 214 and 215 in between and connecting the legs together. The respective tips 214 and 215 include a short elongated strip, which is substantially arranged in parallel to the respective pair of signal lines. The respective leg portions 210, 211 and 202, 213 are arranged with respect to the pair of signal lines with an angle in the range of approximately 45°. In other words, an angle α between the leg portions 210 and 212 as well as 211 and 213 is approximately 90°. Extending now the leg portions adjacent through the respective tips, the corresponding angle would also be in the range of approximately 90°. Second portion 27 is implemented in the same way as portion 26. As a result, the to the shape structures in each portion 26 and 27 form an eye-like structure, a lying "8" or a diamond. In such structures, the electromagnetic field interaction is reduced due to the angle between the tuning lines and the pair of signal lines.

The right part of FIG. 7 illustrates the proposed tunable differential transmission line segment for this embodiment. In the present example, the distance D between the pair of signal line is smaller than the distance D' between the respective tips in the structures of the respective first and second portion 26, 27 of the tuning line segment. One could say, the eyes of the tuning line segments given by portions 26 and 27 open wider than the distance D of the pair of signal lines.

As a result, the tips of all V-shaped structures extend beyond the pair of signal lines when seen from the top view. The tips of the V-shaped structures in the first portion 26 and second portion 27 are arranged below or above the pair of signal lines and next to them, not overlapping any material of the pair of signal lines. The overall portion of material of the tuning lines directly arranged above or below the respective material of the pair of signal lines is smaller compared to the embodiment of FIG. 5. Hence, the magnetic interaction and coupling between the pair of signal lines and the pair of tuning lines is also slightly changed compared to the embodiment of FIG. 5.

The respective eye-like structures in FIG. 5 and FIG. 7 can be implemented in various ways with different distances for each portion 26 and 27 between the tips facing each other. Thus, different coupling factors between the pair of signal lines and the pair of tuning line segments can be achieved.

Figure 8:
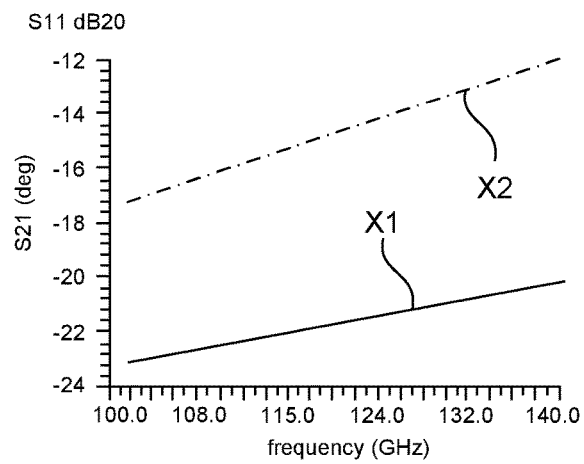
FIG. 8 shows various signal flow graphs illustrating exemplary S-parameters for the tunable differential transmission line segment of the third embodiment.
Figure 8:
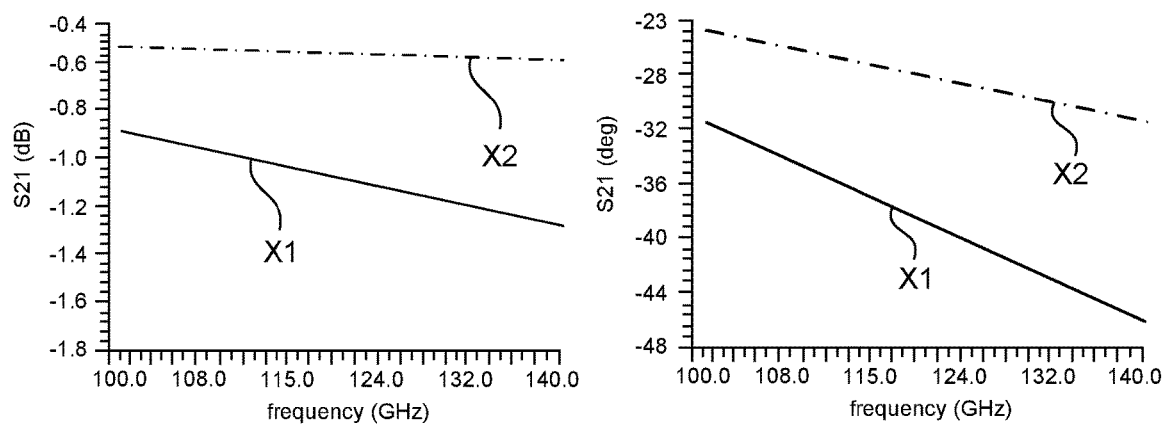

FIG. 8 illustrates the various graphs showing the different as parameters S11(dB), S21(dB), S21(deg) for the main adjustment cases of the tuning element, in which the impedance or resistance of the tuning element is set to maximum and minimum, respectively. Curve X1 illustrates the behavior of the transmission line with the impedance and the resistance of the tuning element set to high. Curve X2 shows of the behavior, when the resistance of the tuning element is set to its minimum value, thus resulting in a good coupling between the portions 26 and 27. As shown, the insertion loss in S21(dB) is further reduced between −0.9 dB at 100 GHz (for a high resistance) to a maximum of about −1.4 dB at 140 GHz. The increase of the insertion loss between the high and low resistance of the tuning element is approximately 0.8 dB.

The phase shift as seen in S21(deg) of FIG. 8 between the maximum and minimum value of the tuning element increases from about 9° at 100 GHz to approximately 15° at 140 GHz.

As visible from the various graphs illustrating the different exemplary embodiments of tunable differential transmission lines segments, the loss increases regularly at frequency above 140 GHz due to additional resonances in the structures. However, for a large range from about 100 GHz to 150 GHz, the proposed tunable differential transmission line segment offers a constant and predictable behavior. Particularly, the amount of tunable phase shifts at a relatively low insertion loss enables to cascade the respective line segments next to each other to achieve the desired phase shift.

Figure 9:
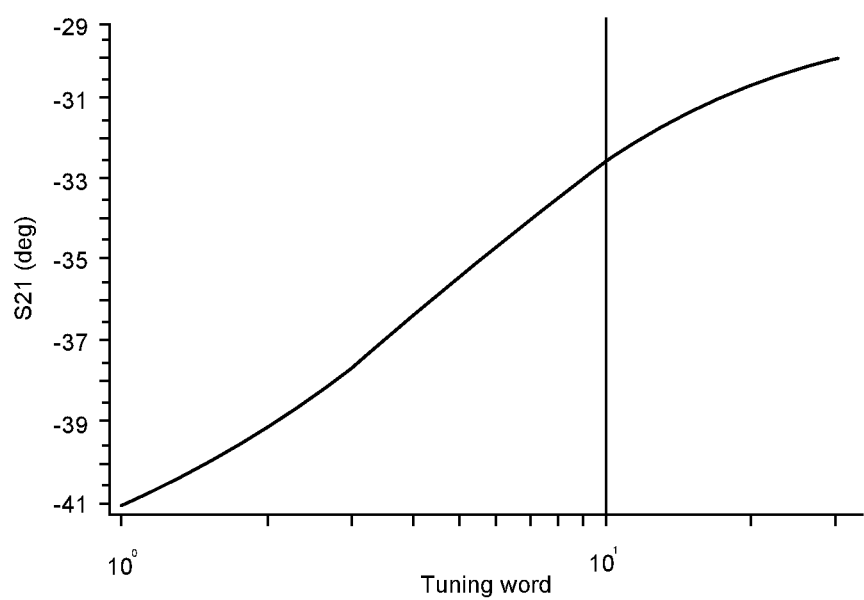
FIG. 9 illustrates a S21 parameter graph in dependence of a tuning word to show the increased tuning range for a tunable differential transmission line segment according to some aspects of the proposed principle.

By adjusting the distance D between the signal lines, a distance between the pair of signal lines and the pair of tuning lines, the thickness of the respective lines, a dielectric material in between and the form of the tuning lines, one has a variety of parameters to adjust the desired phase change and/or insertion loss in a given frequency range. The different adjustable parameter open up for a new variety of tunable differential transmission lines suitable in a variety of frequency ranges FIG. 9 illustrates the overall phase shift at a frequency of approximately 100 GHz for a single tunable differential line segment in dependence of a tuning word that ranges from a minimum value 1 to a maximum value 31 according to some aspects. The tuning word is decimal representation of the digital bits applied to the resistor bank shown in FIG. 2. As illustrated, the phase shift is relatively constant over the logarithmically applied tuning word.

This behavior provides the possibility to cascade a plurality of the previously illustrated transmission line segments of the proposed principle on top of each other to increase as a tunable phase shift range. At the same time, the cascade of lines has predictable insertion loss, as the insertion loss for each line segments have to be substantially summed up.

Figure 10:
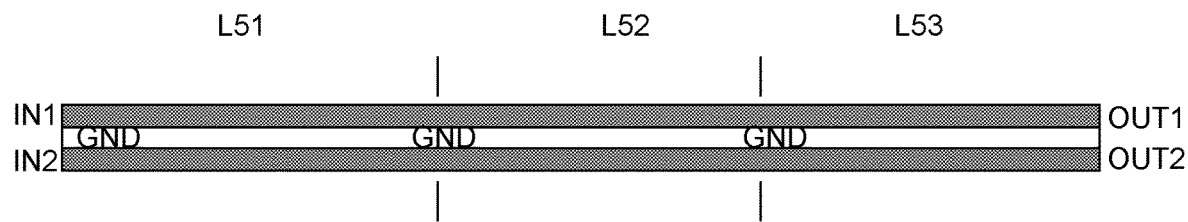
FIG. 10 is an embodiment of a tunable differential transmission line with several segments as shown in FIG. 3.
Figure 11:
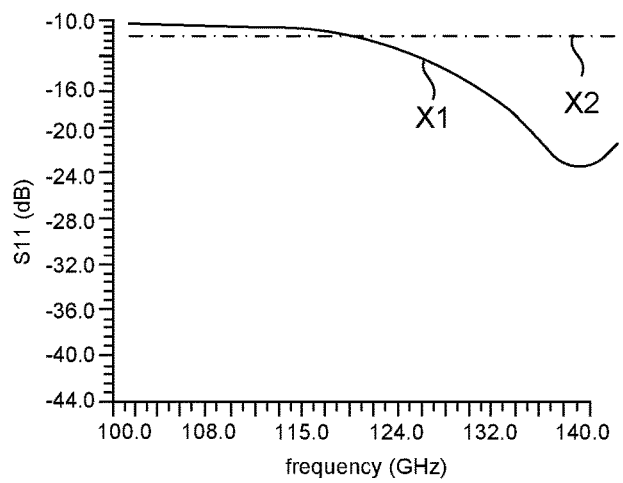
FIG. 11 shows various signal flow graphs illustrating exemplary S-parameters for the tunable differential transmission line of FIG. 10.
Figure 11:
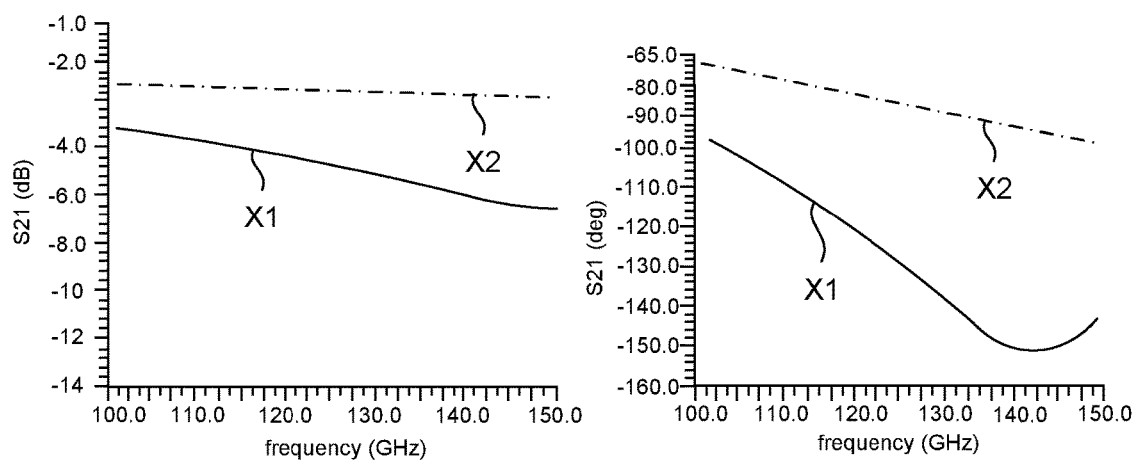

FIGS. 10 and 11 show the behavior of a tunable differential transmission line having three line segments LS1, LS2 and LS3 of a pair of elongated signal lines and a pair of elongated tuning lines attached to each other. While the respective pair of signal line segments are connected directly to each other, simply forming a pair of longer located signal lines, the respective pair of tuning lines comprise three tuning line segments.

These tuning line segments are connected at the respective transition sections between the different segments LS1, LS2 and LS3 to the ground terminal. In other words, the tuning line is connected to the ground potential on the far left and far right side of the transmission line as well as in between, and particularly at the border between the adjacent line segments LS1, LS2 and LS2, LS3.

FIG. 11 illustrates the behavior for the S-parameter sets for the cascaded tunable differential transmission line. As shown, the reflection in the graph S11(dB) for the low resistance value of the respective tuning elements is relatively constant at −10 dB over the desired frequency range from 100 GHz to 150 GHz. For a high resistance in the tuning elements as given in the curve X1, the reflection is similar between 100 GHz to approximately 122 GHz and then drops to a minimum of −24 dB at 145 GHz. This resembles a resonance pole at that frequency point. In contrast, the insertion loss as shown in parameter S21(dB) is relatively small and increases from about −4 dB to approximately −7.5 dB at 150 GHz. Finally, the phase shift between the high and low resistance values for the respective tunable elements is about 35° at 100 GHz and increases to approximately 60° at 145 GHz, wherein that frequency the curve X1 for the high impedance resistance value of the tuning elements includes a minimum phase of −155 degrees. These values scale dependent from the values of a single transmission line segment and the number of segments attached together.

Figure 12:
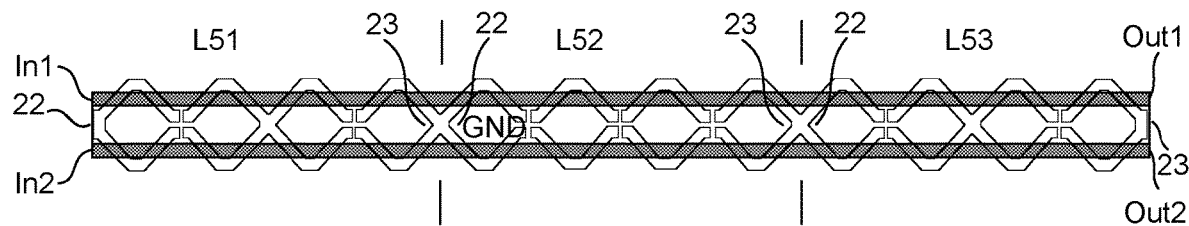
FIG. 12 is another embodiment of a tunable differential transmission line with several segments as shown in FIG. 5.
Figure 13:
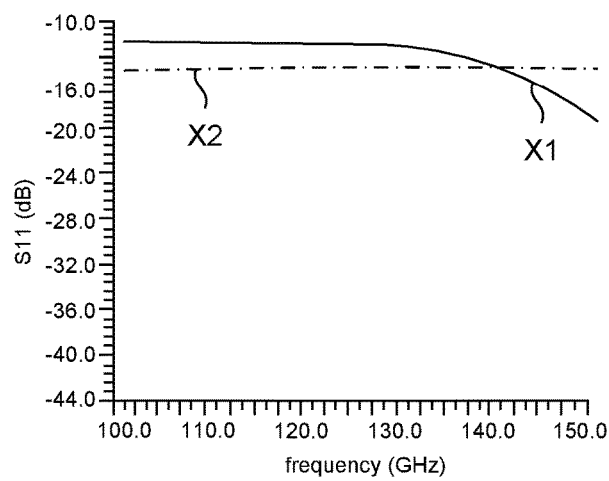
FIG. 13 shows various signal flow graphs illustrating exemplary S-parameters for the tunable differential transmission line of FIG. 12.
Figure 13:
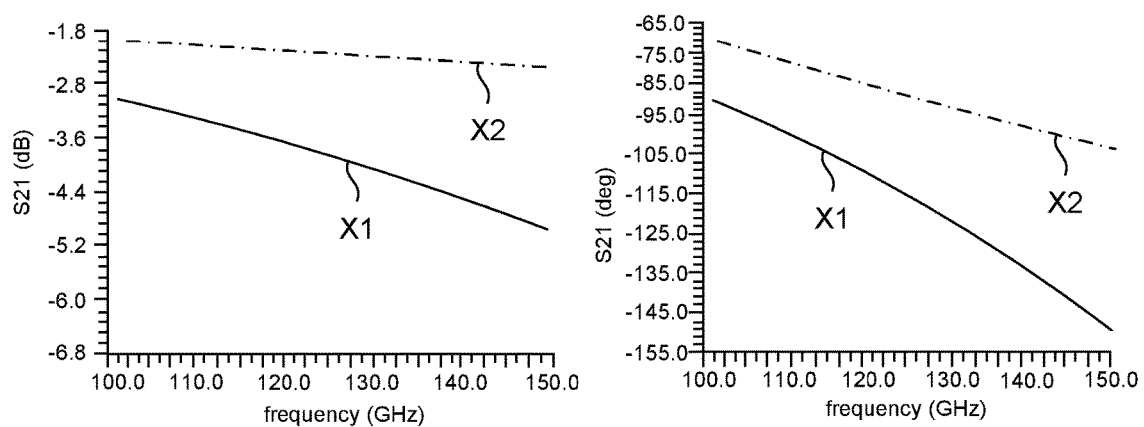

FIGS. 12 and 13 illustrate a tunable differential transmission line of a different embodiment according to the proposed principle and the corresponding S-parameter set having three consecutive line segments with diamond- or eye-like structures as the respective tuning lines. The line segments cascaded together in FIG. 12 correspond to the transmission line segment of FIG. 5. As shown, the transmission line comprises input terminals IN1 and IN2 for the pair of elongated signal lines as well as output terminals OUT1 and OUT2. The cascaded tuning line is coupled to a ground terminal 22 at the proximity of the input terminals IN1 and IN2, as well as to a ground terminal 23 at the proximity of the output terminals OUT1 and OU2. In addition, the respective cascaded tuning line segments are connected to corresponding ground terminals 23, 22 at the border of each line segment LS1, LS2 and LS3. As a result, and similar to the previous example, the cascaded pair of tuning lines comprises in total four ground terminals, whereas two of the ground terminals are located at the respective borders between adjacent pair of tunable line segments of the cascaded pair of tuning lines.

As shown in FIG. 13, the various S-parameters behaves in a similar fashion within the cascaded transmission line segments compared to an individual line segment. In other words, the insertion loss at 100 GHz frequency for the whole transmission line is approximately three times the insertion loss for a single transmission line segment. Likewise, the total insertion loss of approximately −5 dB at 150 GHz for curve X1 corresponds to approximately three times the insertion loss for the curve for a single tunable line segment. The same behavior is also visible in the parameter S21(deg), whereas the total phase shift between the high and low resistance value for the tunable line ranges from approximately 20° at 100 GHz to about 50° at 150 GHz. In contrast to the previous embodiment with the tunable differential transmission line having a pair of elongated tuning lines, the phase shift particularly for curve X1 corresponding to the high resistance for the tuning elements is substantially constant.

Figure 14:
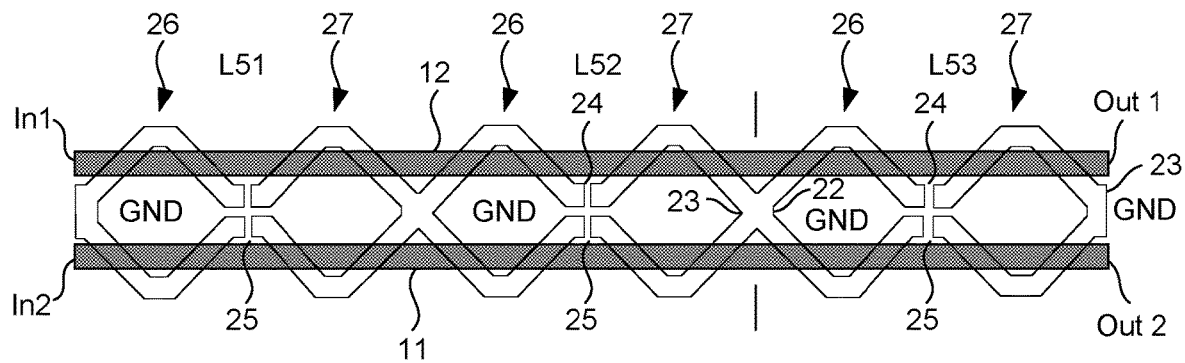
FIG. 14 is another embodiment of a tunable differential transmission line with several segments as shown in FIG. 7.

Finally, FIG. 14 illustrates an embodiment, in which three tunable differential transmission line segments according to FIG. 7 are cascaded to form a tunable differential transmission line. The tunable differential transmission line comprises three tuning elements 24 and 25, which are connected together as in the previous examples to allow a continuous and constant resistance change over the whole tuning lines. In addition, further ground terminals 23, 22 are provided at the borders of the respective line segments LS1, LS2 and LS3. As in the previous examples, each tuning line segment is therefore connected between two ground terminals, while the pair of signal lines are simply elongated signal lines between the input terminals IN1, IN2 and the output terminals OUT1, OUT2.

Figure 15:
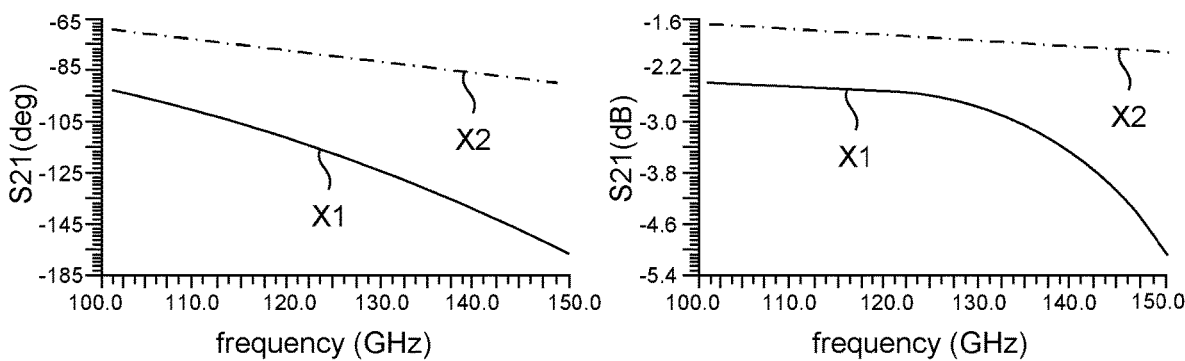
FIG. 15 shows various signal flow graphs illustrating exemplary S-parameters for the tunable differential transmission line of FIG. 14.
Figure 15:
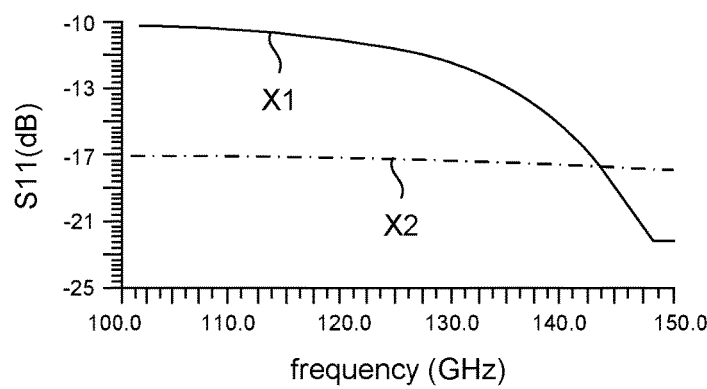

FIG. 15 illustrates the behavior of the tunable differential transmission line according to FIG. 14 with regard to its respective S-parameters. The insertion loss S21(dB) at around 100 GHz starts at approximately −2.3 dB and is relatively constant until approximately 125 GHz. Then the insertion loss increases with a high resistance value to approximately −4.2 dB at 150 GHz, see curve X1. In contrast thereto, for a low impedance the insertion loss increases only slightly between one −1.6 dB at 100 GHz to approximately −1.9 dB at 150 GHz. The increase of the insertion loss at frequencies approximately about 150 GHz is caused by resonances in the structure of the tuning line. The phase shift by the tunable differential transmission line as shown in parameter S21(deg) ranges from about 28° at 100 GHz to approximately 60° at about 150 GHz. The three examples therefore illustrate the wide tuning range when cascading various tuning line segments to each other. The insertion loss is relatively low and scalars mainly proportional with the number of cascaded line segments. Only at very large frequency ranges and high resistance values, the resonance behavior becomes visible, caused by the magnetic interaction between the tuning line segments and the signal lines.

Figure 18:
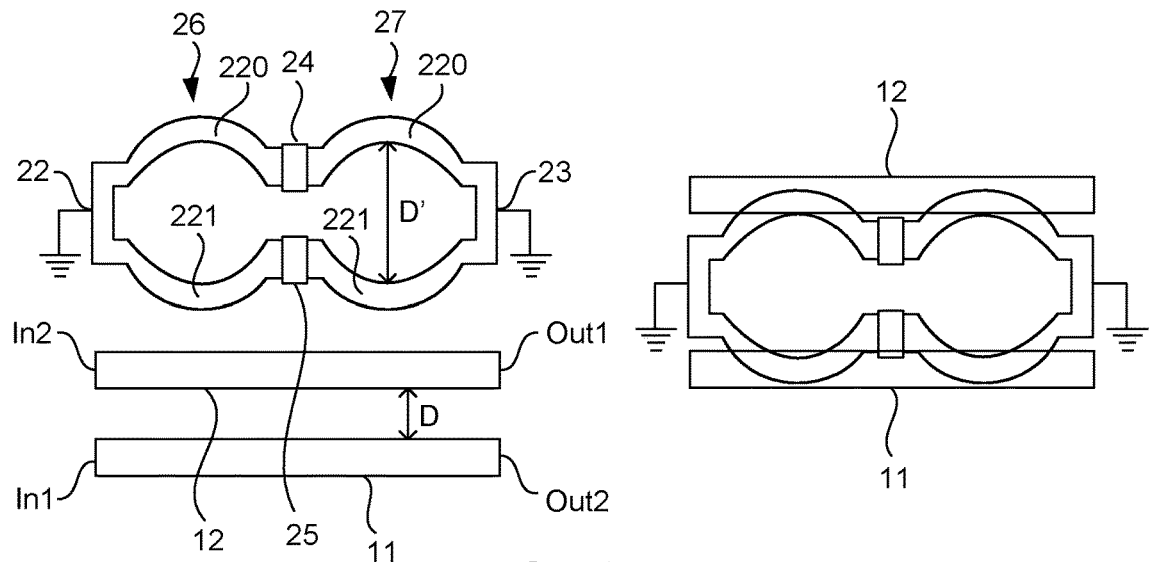
FIG. 18 illustrates another embodiment a tunable differential transmission line segment according to some aspects of the proposed principle.
Figure 19:
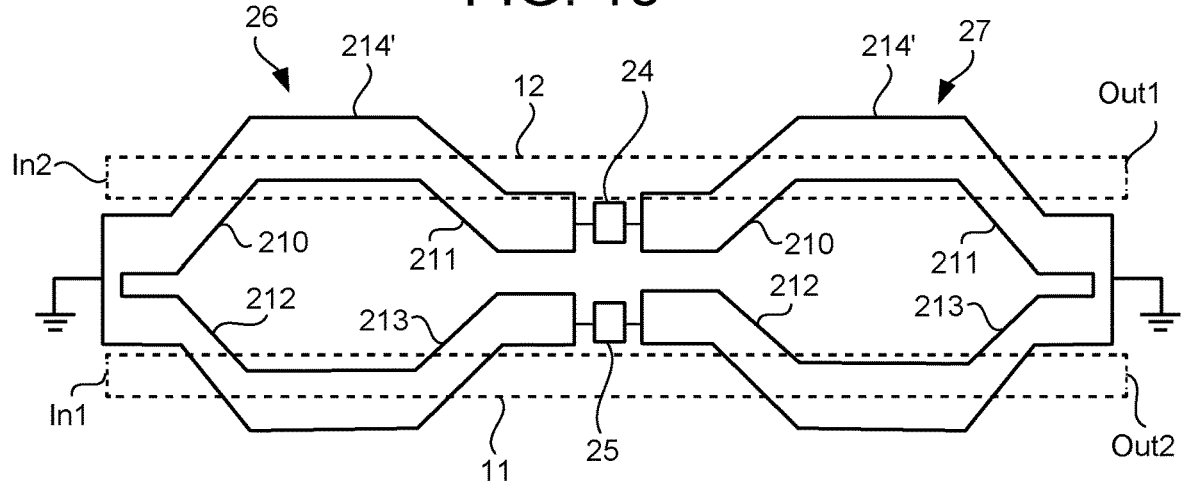
FIG. 19 shows yet another embodiment a tunable differential transmission line segment according to some aspects of the proposed principle.

Referring now to FIG. 18 and FIG. 19, which show additional embodiments of the tunable differential transmission line segment in accordance with the several aspects of the proposed principles. In FIG. 18, a pair of signal lines 11 and 12 is arranged in parallel and distanced D' to each other between input terminals IN1, IN2 and output terminals OUT1 and OUT2. A pair of tuning lines for this embodiment is formed in and eye- or glasses-like structure having a first portion 26 and a second portion 27 coupled together via tuning elements 24 and 25. First portion 26 is coupled to ground terminal 22 and second portion 27 is connected to ground terminal 23. In this embodiment, each portion comprises two half circles 220, 221, which are mirrored along an axis through the ground terminals 22 and 23, respectively. The half circles in this example of the two portions 26 and 27 form a glasses-like structure with the smallest distance in the area of the tuning elements 24 and 25.

The right portion of the FIG. 18 illustrates the arrangement of the tunable differential transmission line segment with the pair of signal lines and the pair of the tuning lines stacked on top of each other. As shown, the distance D' between the pair of tuning lines is arranged such that it is similar to the distance D of the pair of signal lines. As a result, only a portion of the pair of tuning lines is located directly under or above the pair of signal lines. However, as stated previously, the distance D between the pair of signal lines and the pair of tuning lines as well as the form and shape of the pair of the tuning lines can be designed to fit the requirements with regard to the parameters desired to be achieved.

FIG. 19 illustrates a further embodiment of an adjustable differential transmission line segment. In this embodiment, the pair of signal lines 11 and 12 are arranged below or above the respective pair of tuning lines with the first portion 26 and the second portion 27 coupled together by a pair of tuning elements 24 and 25. In this particular example, each portion 26 and 27 of the pair of tuning lines comprises two sections having two legs 210, 211 and 212, 213 connected together via an elongated strip 214'. This structure resembles the eye- or diamond-like structure as presented in the previous examples, with the exception that the elongated strip portion 214' is extended in comparison to the previous embodiments. This means that the elongated strip portion 214' extends partially in parallel to the respective signal lines 11 or 12, thus enhancing the magnetic coupling between the pair of signal lines and the pair of tuning lines. Further, the angle between one of the leg portions and the elongated strip portion lies in the range of approximately 45°, which is a suitable angle, particularly for printed circuit boards. The reduced angle will decrease reflections and other stray effects during the electromagnetic coupling.

The various examples and embodiments shown herein can be implemented in a variety of different applications for radio communication. For example, the tunable differential transmission line segments can be part of filter arrangements, transmission or delay lines, in which differential signals need to be phase shifted compared to a second differential signal. The tunable differential transmission line segment are of particular use, when quadrature signals need to be generated, in which the respective signal portions have a dedicated phase shift to each other. In this regard, the phase shift does not need to be exactly 90° as in classical quadrature signal generation, but can be any other specific dedicated phase shift. Hence, it may be suitable to adjust the phase shift between two differential signals by some degree to compensate to additional skew in the subsequent signal path.

Figure 17:
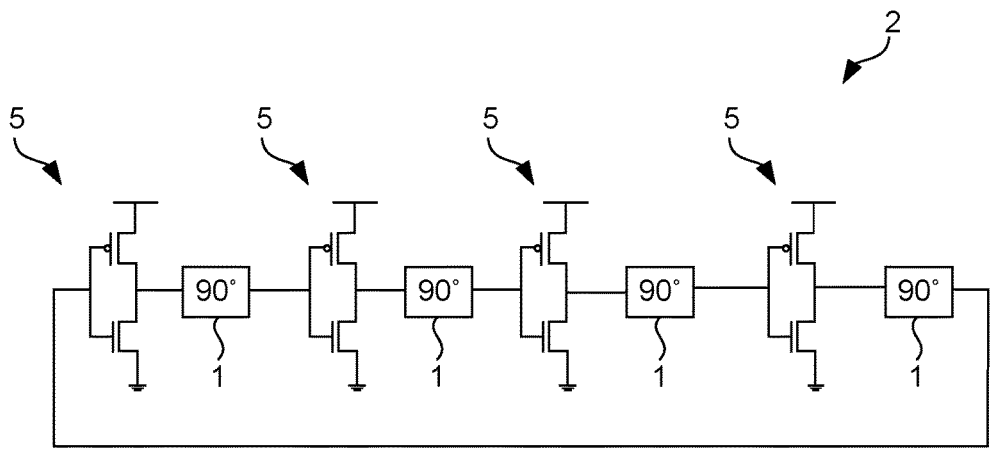
FIG. 17 shows an exemplary embodiment of an oscillator using a tunable differential transmission line segment according to some aspects of the proposed principle.

One exemplary embodiment for an oscillator using a tunable differential transmission line segment according to some aspects of the proposed principle is presented in FIG. 17. The oscillator 2 comprises an inverter chain with a plurality of inverters 5. The output of each inverter 5 is connected to a tunable transmission line segment 1 in accordance with some aspects of the proposed principle. The last tunable transmission line segment 1 is connected to the input of the first inverter 5 of the inverter chain to form a loop. Hence, the tunable transmission line segments 1 are arranged between an output and an input of an inverter in the respective chain. The oscillator 2 utilizes the tunable transmission line segments 1 to tune the phase delay between the different stages of the inverter chain, thereby adjusting the overall output frequency.

Figure 16:
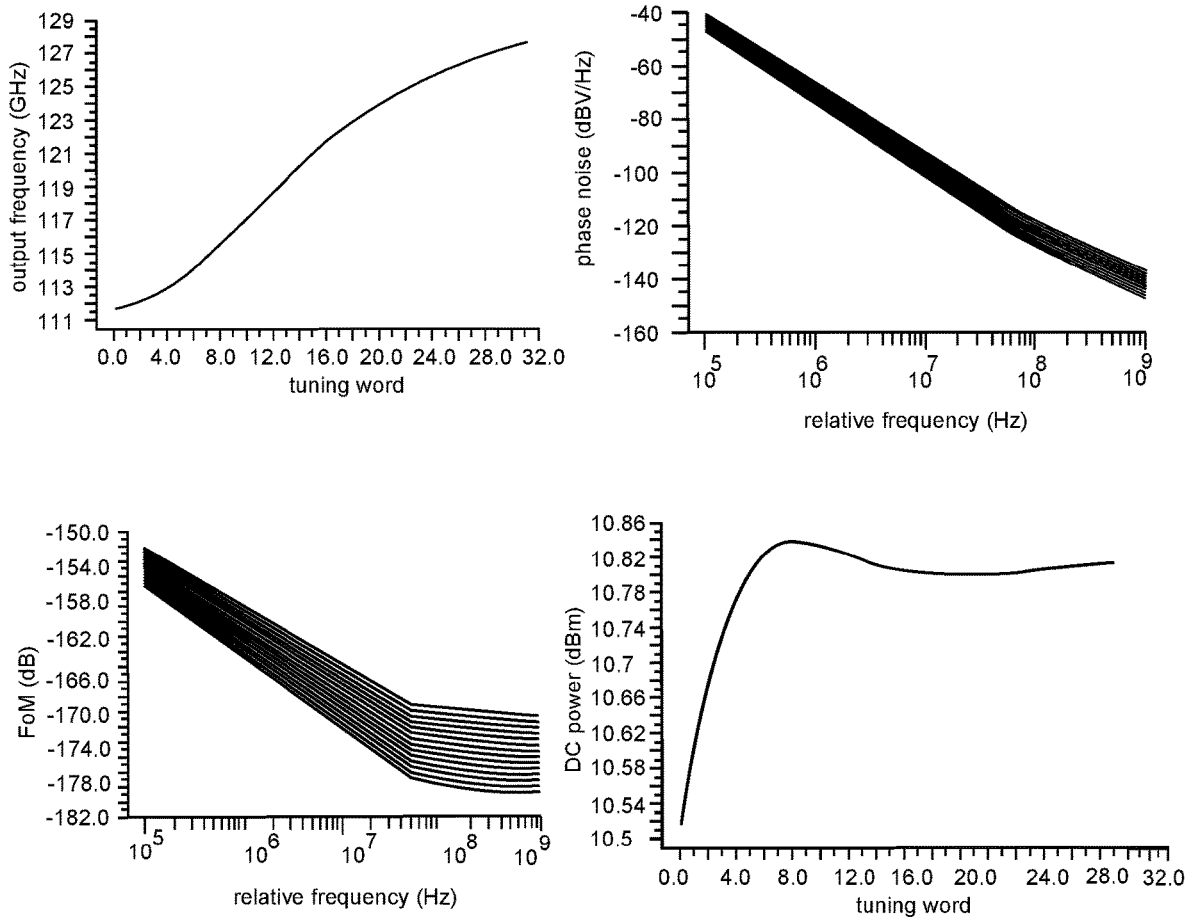
FIG. 16 illustrates various signal flow graphs of a simulated voltage controlled oscillator having a tunable differential transmission line.

FIG. 16 illustrates some graphs showing various aspects of a simulated quadrature voltage controlled oscillator using a single tunable differential transmission line segment according to the embodiment of FIG. 7. Since voltage controlled oscillators require resonators with a high quality factor Q, the proposed phase shifter was used in a simulated voltage controlled oscillator using a 22 nm CMOS process. The frequency output signal of the simulated voltage controlled oscillator is above 110 MHz. For such frequencies, the inductors are very small and impractical to implement. Further, varactor diodes or capacitances normally used for oscillator tanks have a very low quality value Q and as such render LC resonator tanks unattractive for voltage controlled oscillators in this frequency range.

Thus, a single tunable differential transmission line segment has been used as a tunable phase shifter to provide a 90° phase shift. The simulation proves that such tunable differential transmission line segment enable a very efficient tuning in a wide range in such quadrature voltage controlled oscillator. The diagram in FIG. 16 illustrates the Figure of Merit FoM(dB) of the voltage controlled oscillator in the lower left. The tuning range given by the output frequency over a tuning word is illustrated in the upper left graph.

These two figures would uncover major flaws in the simulation if any. For example, tuning range is reduced due to insufficient phase shift, and a poor FoM result indicates an increased loss. However, the simulated quadrature voltage controlled oscillator achieves an impressive tuning range of about 15% from 111 GHz to 129 GHz with a minimum FoM between −172 dB and −180 dB. The increase in the FoM at lower relative frequencies is due to the aggressive targeted tuning range, which cause additional parasitic in the QVCO. The phase noise illustrated in the upper right corner scales linearly with the logarithmic relative frequency and the DC power in dBm is substantially constant over the applied range given by the tuning word.

Figure 20:
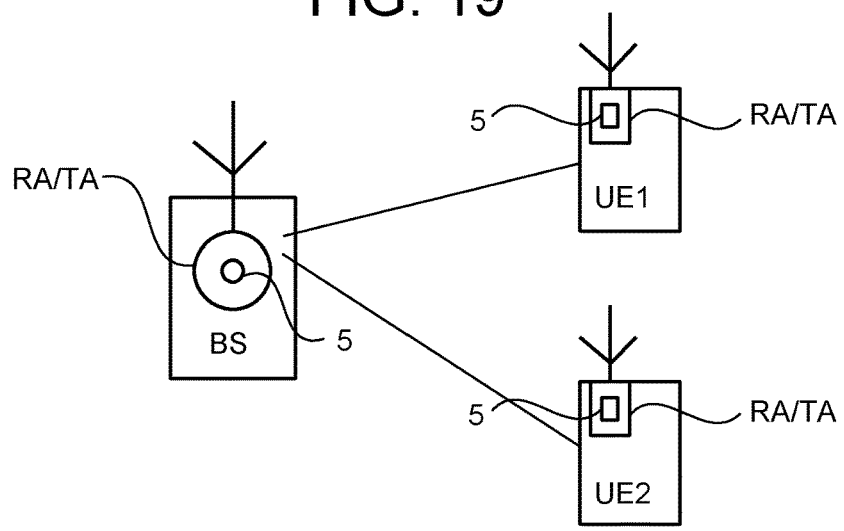
FIG. 20 illustrates an exemplary embodiment of a radio communication network including eNodeB and user equipment, in which tunable differential transmission line segments according to the proposed principle can be implemented.

The above-mentioned applications can be part of larger devices for radio communication. FIG. 20 illustrates an example for a radio communication in which the tunable differential transmission line in form of cascaded transmission line segments are implemented. In the example of FIG. 20, a base station or eNodeB BS comprises a receiver and/or transmitter arrangement RA/TA connected to an antenna. The receiver and/or transmitter arrangement may comprise a plurality of different components as exemplary stated above that utilize the proposed tunable differential transmission line either as an individual line segment or in the form of cascaded transmission line segments. The basic station eNodeB BS communicates with several user devices UE1, UE2 as defined above. The respective user devices may also comprise a receiver and/or transmitter arrangement, including one or more element utilizing the tunable differential transmission line.

In this regard, the communication frequency between the eNodeB BS and the different user devices UE1 and UE2 may differ and range from several GHz up 150 GHz. In this regard, the user devices UE1 and UE2 can also be replaced by other eNodeB BS. In such application, the eNodeB BS may use microwave communication in the range of 100 GHz to 150 GHz utilizing the various components disclosed herein.

The description of the example embodiments provided herein have been presented for purposes of illustration. The description is not intended to be exhaustive or to limit example embodiments to the precise form disclosed, and modifications and variations are possible in light of the above teachings or may be acquired from practice of various alternatives to the provided embodiments. The examples discussed herein were chosen and described in order to explain the principles and the nature of various example embodiments and its practical application to enable one skilled in the art to utilize the example embodiments in various manners and with various modifications as are suited to the particular use contemplated. The features of the embodiments described herein may be combined in all possible combinations of methods, apparatus, modules, systems, and computer program products. It should be appreciated that the example embodiments presented herein may be practiced in any combination with each other.

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the em20bodiments being defined by the following claims.

REFERENCE LIST $L_a$, $L_u$ inductance
$Z_t$ tunable impedance
In, Out Input, Output
D, D' distance
d distance
1 tunable transmission line segment
2 series oscillator
5 Inverter
10 pair of signal line segments
11, 12 transmission line segment
20 pair of tuning line segments
22, 23 reference terminal
24, 25 tuning element
26 first portion
27 second portion
200, 201 elongated strip
202, 203 elongated strip
204, 214 tip
210, 211 leg
212, 213 leg
214, 215 tip
214' elongated strip portion
220, 221 curved elongated strip
260, 261 V-shaped elongated strip
270, 271 V-shaped elongated strip
263 legs

The invention claimed is:

1. A tunable differential transmission line segment, comprising:
 a differential pair of signal line segments arranged in a first plane; and
 a pair of tuning line segments arranged in a second plane substantially parallel to the first plane, wherein
 the pair of tuning line segments is at least capacitively coupled to the differential pair of signal line segments,
 the pair of tuning line segments is connected with its respective end terminals to a common reference potential, and
 the tunable differential transmission line segment further comprises a tunable element arranged between a first portion and a second portion of the pair of tuning line segments.

2. The tunable differential transmission line segment of claim 1, wherein the tunable element is configured to change the impedance of the pair of tuning lines segments.

3. The tunable differential transmission line segment of claim 1, wherein the tunable element comprises a pair of tunable resistors coupled to the first portion and second portion.

4. The tunable differential transmission line segment of claim 3, wherein each tunable resistor of the pair of tunable resistors comprises a field effect transistor arranged between a first node and a second node with its gate terminal configured for receiving a control signal.

5. The tunable differential transmission line segment of claim 4, wherein the field effect transistors comprises:
 a metal-oxide field effect transistor, MOSFET;
 a junction field effect transistor, JFET; and/or a metal-semiconductor field-effect transistor, MESFET.

6. The tunable differential transmission line segment of claim 3, wherein each tunable resistor of the pair of tunable resistors comprises a plurality of field effect transistors arranged in parallel between a first node and a second node with their respective gates configured to receive a digital control word.

7. The tunable differential transmission line segment of claim 3, wherein each of the plurality of field effect transistors comprise a channel width and a channel length, the respective channel width or channel length of two adjacent field effect transistors being different by a factor of 2.

8. The tunable differential transmission line segment of claim 1, wherein the tunable element comprises a pair of tunable capacitances coupled to the first portion and second portion.

9. The tunable differential transmission line segment of claim 1, wherein in top view, the differential pair of signal line segments and the pair of tuning line segments are at least partially overlapping.

10. The tunable differential transmission line segment of claim 1, wherein in top view, the differential pair of signal line segments and the pair of tuning line segments comprise the same shape, and/or dimensions.

11. The tunable differential transmission line segment of claim 1, wherein a width of each line segment of the pair of tuning line segments is larger than a corresponding line segment of the pair of signal line segments.

12. The tunable differential transmission line segment of claim 1, wherein
 each of the first and the second portions of the pair of tuning line segments comprises a first elongated strip and a second elongated strip arranged parallel to the first elongated strip, and
 both elongated strips are coupled together at their respective ends.

13. The tunable differential transmission line segment of claim 1, wherein
 the first portion of the pair of tuning line segments comprises at least one first V-shaped elongated strip and at least one second V-shaped elongated strip arranged such that it mirrors the at least one first V-shaped elongated strip of the first along an axis through the respective end terminals, and
 the second portion of the pair of tuning line segments comprises at least one first V-shaped elongated strip and at least one second V-shaped elongated strip arranged such that it mirrors the at least one first V-shaped elongated strip of the second portion along an axis through the respective end terminals.

14. The tunable differential transmission line segment of claim 13, wherein in top view tips of the at least one first and second V-shaped elongated strips of the respective first and second portions extend beyond the differential pair of signal line segments.

15. The tunable differential transmission line segment of claim 13, wherein legs of the at least one first and second V-shaped elongated strips form an angle between 55° and 115°.

16. The tunable differential transmission line segment of claim 13, wherein tips of the at least one first and second V-shaped elongated strips of the respective first and second portions comprise a section extending substantially parallel to the differential pair of signal line segments.

17. The tunable differential transmission line segment of claim 13, wherein the first and the second portions of the pair of tuning line segments comprise the same number of first and second V-shaped elongated strips.

18. The tunable differential transmission line segment of claim 1, wherein the differential pair of signal line segments and the pair of tuning line segments comprise lumped elements arranged on a printed circuit board and/or are surrounded by a dielectric material.

19. The tunable differential transmission line segment of claim 1, configured with the dimensions of the differential pair of signal line segments to conduct an electromagnetic signal with a center frequency above 60 GHz.

20. A voltage controlled oscillator, comprising:
a first inverter connected in series with a second inverter; and
a tunable differential transmission line comprising the tunable differential transmission line segment of claim 1, wherein
the tunable differential transmission line segment is arranged between an output of the first inverter and an input of the second inverter.

21. The voltage controlled oscillator of claim 20, wherein the tunable differential transmission line comprises a phase shifting range between 0° and 90°.

22. An integrated circuit comprising the voltage controlled oscillator of claim 20.

23. A transmitter arrangement (TA) communication, comprising the tunable differential transmission line segment of claim 1.

24. A receiver arrangement (RA) comprising the tunable differential transmission line segment of claim 1.

25. An integrated circuit comprising the tunable differential transmission line segment of claim 1.

26. A mobile radio apparatus for use in mobile radio communication comprising:
a transmitter arrangement; and
a receiver arrangement, wherein
the transmitter arrangement and/or the receiver arrangement comprises the tunable differential transmission line segment of claim 1.

* * * * *